United States Patent
Hong

(10) Patent No.: US 11,837,311 B2
(45) Date of Patent: Dec. 5, 2023

(54) INTEGRATED CIRCUIT, MEMORY AND OPERATION METHOD OF MEMORY

(71) Applicant: SK hynix Inc., Gyeonggi-do (KR)

(72) Inventor: Yun Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/727,000

(22) Filed: Apr. 22, 2022

(65) Prior Publication Data

US 2023/0162811 A1 May 25, 2023

(30) Foreign Application Priority Data

Nov. 25, 2021 (KR) .......................... 10-2021-0164787

(51) Int. Cl.
*G11C 29/44* (2006.01)
*G11C 29/00* (2006.01)
*G11C 29/18* (2006.01)

(52) U.S. Cl.
CPC .......... *G11C 29/4401* (2013.01); *G11C 29/18* (2013.01); *G11C 29/787* (2013.01); *G11C 2029/1802* (2013.01)

(58) Field of Classification Search
CPC ... G11C 29/4401; G11C 29/18; G11C 29/787; G11C 2029/1802

USPC ......................................................... 714/764
See application file for complete search history.

(56) References Cited

U.S. PATENT DOCUMENTS

| | | | |
|---|---|---|---|
| 2007/0033449 A1* | 2/2007 | Hwang | G11C 29/028 714/710 |
| 2021/0065836 A1* | 3/2021 | Ahn | G11C 29/12015 |
| 2021/0166777 A1* | 6/2021 | Shen | G11C 29/38 |
| 2021/0233581 A1* | 7/2021 | He | G11C 29/4401 |
| 2021/0357279 A1* | 11/2021 | Lee | G06F 11/0793 |

FOREIGN PATENT DOCUMENTS

KR 10-2015-0002004 A 1/2015

* cited by examiner

*Primary Examiner* — James C Kerveros
(74) *Attorney, Agent, or Firm* — IP & T GROUP LLP

(57) ABSTRACT

A memory includes: a memory array; a nonvolatile memory circuit suitable for storing a plurality of data sets each including flag information and multi-bit data; a plurality of repair register sets suitable for receiving and storing the multi-bit data included in the data sets whose flag information is marked for repair among the data sets during a boot-up operation; a plurality of setting register sets suitable for storing setting information included in the data sets whose flag information is marked for setting among the data sets during the boot-up operation; and a repair circuit suitable for repairing a defect in the memory array based on the multi-bit data stored in the repair register sets.

13 Claims, 4 Drawing Sheets

| Data Set | MSB N (Flag) | N-1 | N-1 | ... | 3 | 2 | 1 | LSB 0 |
|---|---|---|---|---|---|---|---|---|
| 401 | 0 | 1 | 0 | ... | 0 | 1 | 0 | 0 |
| 402 | 1 | 1 | 0 | ... | 0 | 1 | 1 | 0 |
| 403 | 0 | 0 | 1 | ... | 1 | 1 | 0 | 1 |
| 404 | 0 | 0 | 0 | ... | 0 | 0 | 0 | 0 |
| 405 | 1 | 1 | 1 | ... | 0 | 0 | 1 | 1 |
| 406 | 0 | 0 | 1 | ... | 1 | 0 | 0 | 0 |

INTEGRATED CIRCUIT, MEMORY AND OPERATION METHOD OF MEMORY

CROSS-REFERENCE TO RELATED APPLICATIONS

The present application claims priority to Korean Patent Application No. 10-2021-0164787, filed on Nov. 25, 2021, which is incorporated herein by reference in its entirety.

BACKGROUND

1. Field

Various embodiments of the present invention relate to a memory.

2. Description of the Related Art

In the early stage of a semiconductor memory device industry, there were many originally good dies on the wafers, which means that a memory could be produced through a semiconductor fabrication process with no defective memory cells. However, as the capacity of memories increases, it became difficult to fabricate a memory device that does not have any defective memory cells, and nowadays, it may be said that there is substantially no chance that a memory device is fabricated without any defective memory cells. To address this issue, a repair method of including redundant memory cells in a memory and replacing defective memory cells with the redundant memory cells may be used.

SUMMARY

Embodiments of the present invention are directed to providing a technique for efficiently using resources that are required for memory repair and configuration.

In accordance with an embodiment of the present invention, a memory includes: a memory array; a nonvolatile memory circuit suitable for storing a plurality of data sets each including flag information and multi-bit data; a plurality of repair register sets suitable for receiving and storing the multi-bit data included in the data sets whose flag information is marked for repair among the data sets during a boot-up operation; a plurality of setting register sets suitable for storing setting information included in the data sets whose flag information is marked for setting among the data sets during the boot-up operation; and a repair circuit suitable for repairing a defect in the memory array based on the multi-bit data stored in the repair register sets.

In accordance with another embodiment of the present invention, an integrated circuit includes: a nonvolatile memory circuit suitable for storing first data sets each including first-level flag information and data, and second data sets each including second-level flag information, a setting address, and setting information; a plurality of first register sets respectively suitable for storing the data included in the first data sets that are read from the nonvolatile memory circuit; and a plurality of second register sets each suitable for storing the setting information included in the second data set which includes the setting address corresponding thereto among the second data sets that are read from the nonvolatile memory circuit.

In accordance with yet another embodiment of the present invention, a method for operating a memory includes: reading a first data set from a nonvolatile memory circuit; confirming that flag information included in the first data set is of a first level; storing repair information included in the first data set in one among a plurality of repair register sets; reading a second data set from the nonvolatile memory circuit; confirming that flag information included in the second data set is of a second level; selecting one of a plurality of setting register sets by decoding a setting address included in the second data set; and storing setting information included in the second data set in the selected setting register set.

In accordance with still another embodiment of the present invention, an integrated circuit includes: a nonvolatile storage circuit suitable for storing therein information pieces each flagged with one of first and second flags and outputting, while the integrated circuit is booted up, the stored information pieces; first and second register sets each suitable for storing therein each of the output information pieces according to a corresponding one of the first and second flags, with which the output information piece is flagged; and a control circuit suitable for performing a first operation according to the information piece stored in the first register set and a second operation according to the information piece stored in the second register set.

DETAILED DESCRIPTION

Figure 1:
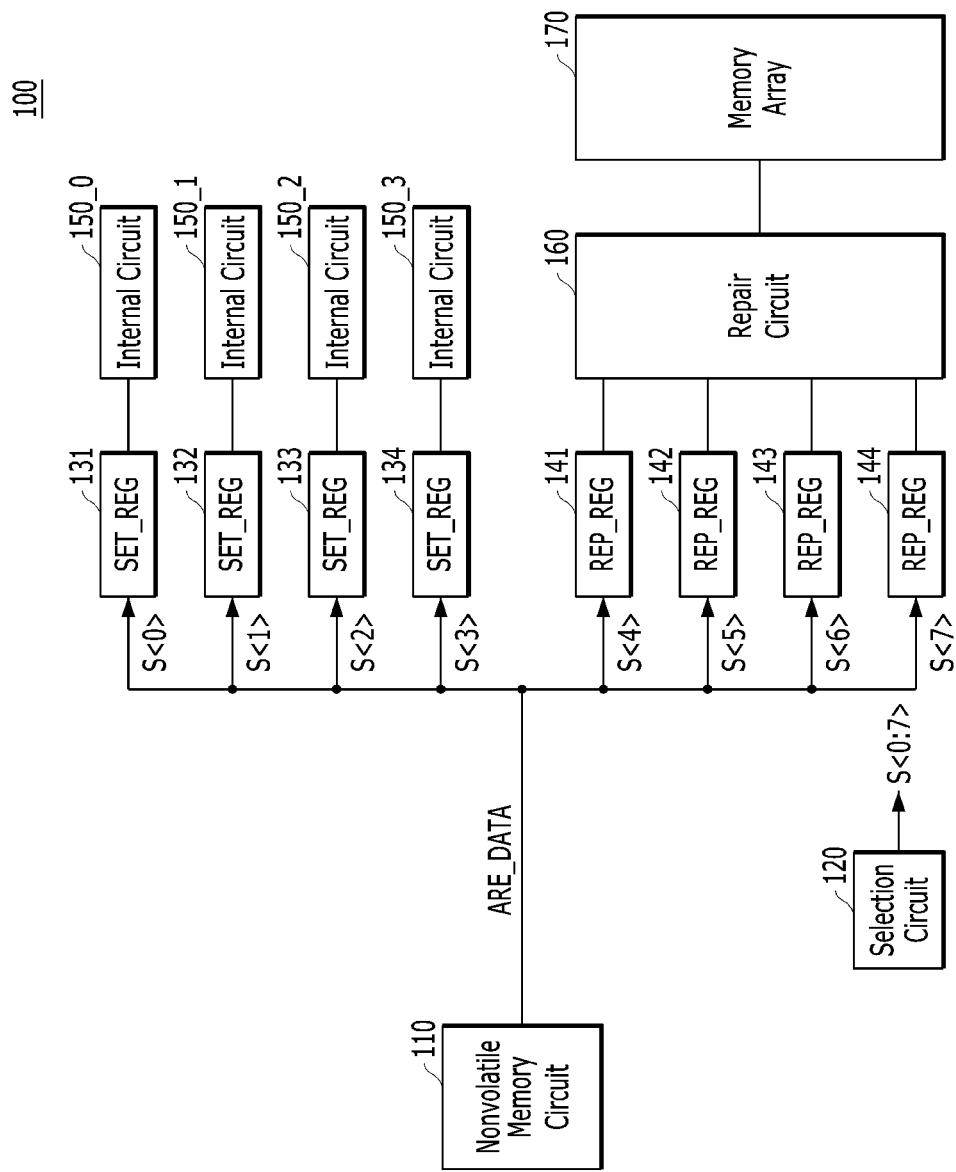
FIG. 1 is a block diagram illustrating a memory in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 1 is a block diagram illustrating a memory 100 in accordance with an embodiment of the present invention.

Referring to FIG. 1, the memory 100 may include a nonvolatile memory circuit 110, a selection circuit 120, setting register sets 131 to 134, repair register sets 141 to 144, internal circuits 150_0 to 150_3, a repair circuit 160, and a memory array 170.

The nonvolatile memory circuit 110 may store data necessary for an operation of the memory 100. The nonvolatile memory circuit 110 may be one among all types of nonvolatile memory circuits, such as an e-fuse array circuit, a NAND flash memory, a NOR flash memory, an Erasable Programmable Read Only Memory (EPROM), an Electrically Erasable Programmable ROM (EEPROM), a Ferroelectric Random Access Memory (FRAM), and a Magnetoresistive RAM (MRAM). Data stored in the nonvolatile memory circuit 110 may be read from and outputted from the nonvolatile memory circuit 110 during a boot-up operation.

Figure 2:
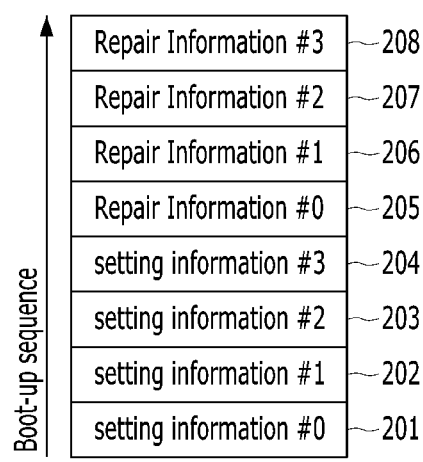
FIG. 2 illustrates data sets that are stored in a nonvolatile memory circuit shown in FIG. 1 in accordance with an embodiment of the present invention.

The nonvolatile memory circuit 110 may store a plurality of data sets. FIG. 2 shows data sets 201 to 208 that are stored in the nonvolatile memory circuit 110 in accordance with an embodiment of the present invention. In the data sets 201 to 208, the type of information may be determined according to locations where corresponding information is stored. The data sets 201 to 204 may include setting information for setting the memory 100. The data set 201 may include $0^{th}$ setting information for setting a voltage level 'A', and the data set 202 may include $1^{st}$ setting information for setting a voltage level 'B'. The data set 203 may include $2^{nd}$ setting information for setting a timing parameter 'C', and the data set 204 may include $3^{rd}$ setting information for setting a timing parameter 'D'. Also, the data sets 205 to 208 may include information for repairing the memory array 170. Each of the data sets 205 to 208 may include information on a defective area in the memory array 170, that is, a defective address corresponding to the defective area. Each of the data sets 201 to 208 may have the same number of bits. As shown ("Boot-up sequence") in FIG. 2, the data sets 201 to 208 may be loaded from the nonvolatile memory circuit 110 to the register sets 131 to 134 and 141 to 144 in the order of 201, 202, 203 . . . 208. The information output from the nonvolatile memory circuit 110 may not be used directly but may be used after being transferred to the register sets 131 to 134 and 141 to 144. The operation of transferring information from the nonvolatile memory circuit 110 to the register sets 131 to 134 and 141 to 144 to utilize the information stored in the register sets 131 to 134 and 141 to 144 may be called a boot-up operation. The boot-up operation may be performed during an initialization of the memory 100.

The selection circuit 120 may generate selection signals S<0:7> for selecting the register sets 131 to 134 and 141 to 144 during the boot-up operation. The selection circuit 120 may sequentially activate the selection signals S<0:7> in the order of S<0> to S<7> during the boot-up operation.

The setting register sets 131 to 134 may receive and store data that are read from the nonvolatile memory circuit 110 during a boot-up operation. The setting register sets 131 to 134 may store data DATA_ARE output from the nonvolatile memory circuit 110 when a selection signal corresponding thereto among the selection signals S<0:3> is activated. During the boot-up operation, data may be output from the nonvolatile memory circuit 110 in the order of the data set 201, the data set 202, the data set 203 and the data set 204, and the selection signals S<0:3> may be activated in the order of S<0>, S<1>, S<2> and S<3>. Accordingly, the setting register set 131 may store the data included in the data set 201, and the setting register set 132 may store the data included in the data set 202. The setting register set 133 may store the data included in the data set 203, and the setting register set 134 may store the data included in the data set 204.

The repair register sets 141 to 144 may receive and store data read from the nonvolatile memory circuit 110 during a boot-up operation. The repair register sets 141 to 144 may store data DATA_ARE output from the nonvolatile memory circuit 110 when a corresponding selection signal among the selection signals S<4:7> is activated. During the boot-up operation, data may be output from the nonvolatile memory circuit 110 in the order of the data set 205, the data set 206, the data set 207 and the data set 208, and the selection signals S<4:7> may be activated in the order of S<4>, S<5>, S<6> and S<7>. Accordingly, the repair register set 141 may store the data included in the data set 205, and the repair register set 142 may store the data included in the data set 206. The repair register set 143 may store the data included in the data set 207, and the repair register set 144 may store the data included in the data set 208.

The internal circuits 150_0 to 150_3 may be circuits that operate based on setting information stored in the setting register sets 131 to 134. The internal circuit 150_0 may be a circuit that generates a voltage 'A' and may set a level of the voltage 'A' based on the setting information stored in the setting register set 131. The internal circuit 150_1 may be a circuit that generates a voltage 'B' and may set a level of the voltage 'B' based on the setting information stored in the setting register set 132. The internal circuit 150_2 may be a circuit that performs an operation 'C' and may set the timing parameters related to the operation 'C' based on the setting information stored in the setting register set 133. The internal circuit 150_3 may be a circuit that performs an operation 'D' and may set the timing parameter related to the operation 'D' based on the setting information stored in the setting register set 134. Here, the operations of the internal circuits 150_0 to 150_3 are mere examples, and the internal circuits 150_0 to 150_3 may perform diverse operations based on the setting information stored in the setting register sets 131 to 134.

The memory array 170 may include a plurality of memory cells for storing data, and circuits for writing data to and reading data from the memory cells.

The repair circuit 160 may repair a defect in the memory array 170 based on the information stored in the repair register sets 141 to 144. Each of the repair register sets 141 to 144 may store a bad address corresponding to the defect of the memory array 170, and the repair circuit 160 may replace the memory cells of the memory array 170 corresponding to the bad addresses stored in the repair register sets 141 to 144 with redundant memory cells.

In the memory 100 of FIG. 1, since the data sets in the nonvolatile memory circuit 110 are matched to the respective register sets 131 to 134, the type of information included in the data sets may be limited. For example, information for setting the voltage 'A' has to be included in the data set 201 to be loaded to the setting register set 131, and the information for setting the timing parameter of the operation 'C' has to be included in the data set 203 to be loaded to the setting register set 133.

Figure 3:
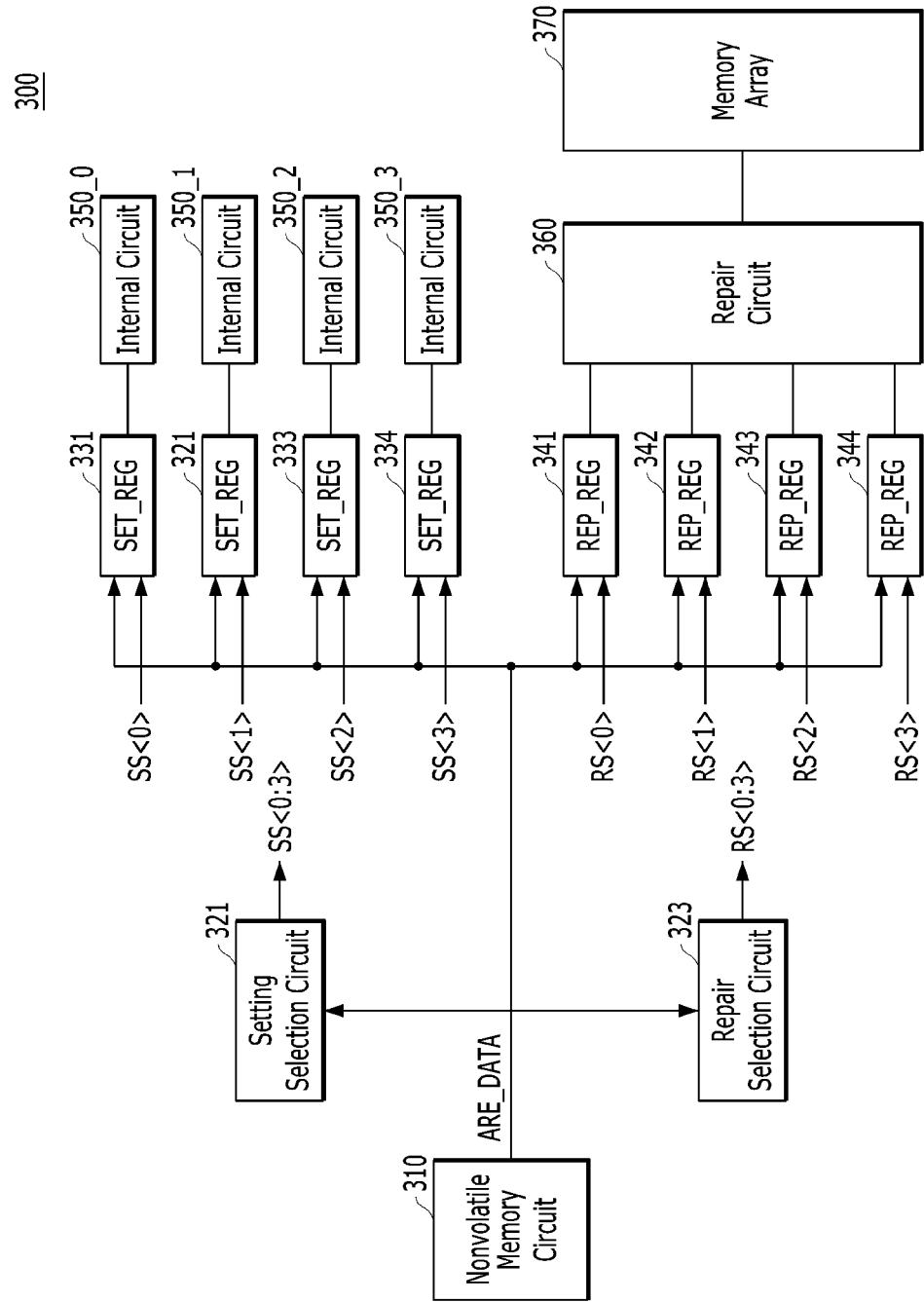
FIG. 3 is a block diagram illustrating a memory in accordance with another embodiment of the present invention.

FIG. 3 is a block diagram illustrating a memory 300 in accordance with another embodiment of the present invention.

Referring to FIG. 3, the memory 300 may include a nonvolatile memory circuit 310, a setting selection circuit 321, a repair selection circuit 323, setting register sets 331 to 334, repair register sets 341 to 344, internal circuits 350_0 to 350_3, a repair circuit 360, and a memory array 370.

The nonvolatile memory circuit 310 may store data necessary for the operation of the memory 300. The nonvolatile memory circuit 310 may be one among diverse types of nonvolatile memory circuits, such as an e-fuse array circuit, a NAND flash memory, a NOR flash memory, an Erasable Programmable Read Only Memory (EPROM), an Electrically Erasable Programmable Read Only Memory (EEPROM), a Ferroelectric RAM (FRAM), and a Magnetoresistive RAM (MRAM). Data stored in the nonvolatile memory circuit 310 may be read and output from the nonvolatile memory circuit 310 during a boot-up operation.

Figures 4, 5:
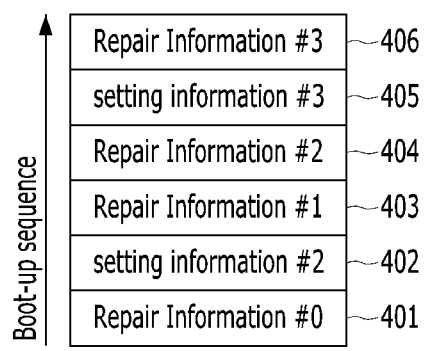
FIG. 4 illustrates data sets that are stored in a nonvolatile memory circuit shown in FIG. 3 in accordance with an embodiment of the present invention.
FIG. 5 is a table showing information included in the data sets shown in FIG. 4 in accordance with an embodiment of the present invention.

The nonvolatile memory circuit 310 may store a plurality of data sets. FIG. 4 illustrates the data sets 401 to 406 that are stored in the nonvolatile memory circuit 310 shown in FIG. 3 in accordance with an embodiment of the present invention. Unlike in FIG. 2, in FIG. 4, the types of the information included in the data sets 401 to 406 may not match to locations where the information is stored. Referring to FIG. 4, it may be seen that the data set 401 includes $0^{th}$ repair information; the data set 402 includes $2^{nd}$ setting information; the data set 403 includes $1^{st}$ repair information; the data set 404 includes $2^{nd}$ repair information; the data set 405 includes $3^{rd}$ setting information; and the data set 406 includes $3^{rd}$ repair information. As shown ("Boot-up sequence") in FIG. 4, the data sets may be loaded from the nonvolatile memory circuit 310 in the order of 401, 402, 403, . . . 406. Although the setting information and the repair information are loaded from the nonvolatile memory circuit 310 in a mixed order, the information included in the data sets 401 to 406 may be transferred to the proper register sets among the setting register sets 331 to 334 and the repair register sets 341 to 344. This is because the information included in the data sets 401 to 406 has a structure as shown in FIG. 5.

FIG. 5 is a table showing information included in the data sets 401 to 406 shown in FIG. 4. Each of the data sets 401 to 406 may include data of N+1 bits. The $N^{th}$ bit of each of the data sets 401 to 406 may be a flag signal indicating whether information included in the corresponding data set is repair information or setting information. When the flag information is '0', it may indicate that information included in the corresponding data set is repair information, and when the flag information is '1', it may indicate that the information included in the corresponding data set is setting information. In FIG. 5, since the flag information ($N^{th}$ bit) of the data sets 401, 403, 404, and 406 is '0', it may be seen that the data sets 401, 403, 404, and 406 store repair information. 0 to $(N-1)^{th}$ bits of the data sets 401, 403, 404, and 406 may be repair information. Also, in FIG. 5, since the flag information ($N^{th}$ bit) of the data sets 402 and 405 is '1', it may be seen that the data sets 402 and 405 store setting information. In the case of the data sets 402 and 405 storing the setting information, the $(N-1)^{th}$ bit and the $(N-2)^{th}$ bit may be setting addresses indicating which setting information the information included in the corresponding data sets is. Namely, the setting address included in the data set 402 may be '10', and the setting address included in the data set 405 may be '11', and bits $0^{th}$ to $(N-3)^{th}$ included in the data sets 402 and 405 may be setting information.

Referring back to FIG. 3, the setting selection circuit 321 may generate selection signals SS<0:3> for the setting information included in the data sets 402 and 405 whose flag information is marked for setting among the data sets 401 to 406 to be loaded from the nonvolatile memory circuit 310 to the setting register sets 331 to 334. The setting selection circuit 321 may decode the setting address to activate one of the selection signals SS<0:3>. When the setting address is '00', the selection signal SS<0> may be activated. When the setting address is '01', the selection signal SS<1> may be activated. When the setting address is '10', the selection signal SS<2> may be activated, and when the set address is '11', the selection signal SS<3> may be activated.

The repair selection circuit 323 may generate selection signals RS<0:3> for storing the repair information included in the data sets 401, 403, 404, and 406 whose flag information is marked for repair among the data sets 401 to 406 to be loaded from the nonvolatile memory circuit 310 to the repair register sets 341 to 344. The repair selection circuit 323 may sequentially activate the selection signals in the order of RS<0> to RS<3> whenever the data sets 401, 403, 404, and 406 whose flag information is marked for repair among the data sets 401 to 406 are sequentially loaded from the nonvolatile memory circuit 310.

The setting register sets 331 to 334 may receive and store data that are read from the nonvolatile memory circuit 310 during a boot-up operation. The setting register sets 331 to 334 may store data DATA_ARE output from the nonvolatile memory circuit 310 when a corresponding selection signal among the selection signals SS<0:3> is activated.

The repair register sets 341 to 344 may receive and store data read from the nonvolatile memory circuit 310 during a boot-up operation. The repair register sets 341 to 344 may store data ARE_DATA output from the nonvolatile memory circuit 310 when a corresponding selection signal among the selection signals RS<0:3> is activated.

The internal circuits 350_0 to 350_3 may be circuits that operate based on the setting information stored in the setting register sets 331 to 334. The internal circuit 350_0 may be a circuit that generates a voltage 'A' and may set the level of the voltage 'A' based on the setting information stored in the setting register set 331. The internal circuit 350_1 may be a circuit that generates a voltage 'B' and may set the level of the voltage 'B' based on the setting information stored in the setting register set 332. The internal circuit 350_2 may be a circuit that performs an operation 'C' and may set a timing parameter related to the operation 'C' based on the setting information stored in the setting register set 333. The internal circuit 350_3 may be a circuit that performs an operation 'D' and may set a timing parameter related to the operation 'D' based on the setting information stored in the setting register set 334. Here, the operations of the internal circuits 350_0 to 350_3 are mere examples, and the internal circuits 350_0 to 350_3 may perform diverse operations based on the setting information stored in the setting register sets 331 to 334.

The memory array 370 may include a plurality of memory cells for storing data, and circuits for writing data to and reading data from the memory cells.

The repair circuit 360 may repair a defect in the memory array 370 based on the information stored in the repair register sets 341 to 344. Bad addresses corresponding to defects of the memory array 370 may be stored in the repair register sets 341 to 344, and the repair circuit 360 may replace the memory cells of the memory array 370 corresponding to the bad addresses stored in the repair register sets 341 to 344 with redundant memory cells.

A boot-up operation process of the memory 300 shown in FIG. 3 will be described with reference to FIGS. 3 to 5.

(1) The data set 401 may be read and output from the nonvolatile memory circuit 310. Since the flag information included in the data set 401 is '0', the repair selection circuit 323 may activate the first selection signal RS<0>, and the $0^{th}$ to $(N-1)^{th}$ bits that are repair information included in the data set 401 may be stored in the repair register set 341.

(2) The data set 402 may be read and output from the nonvolatile memory circuit 310. Since the flag information included in the data set 402 is '1', the setting selection circuit 321 may decode the setting address to activate one of the selection signals SS<0:3>. Since the setting address, which occupies $(N-1)^{th}$ to $(N-2)^{th}$ bits, included in the data set 402 is '10', the setting selection circuit 321 may activate the selection signal SS<2>, and $0^{th}$ to $(N-3)^{th}$ bits, which are setting information included in the data set 402, may be stored in the setting register set 333.

(3) The data set 403 may be read and output from the nonvolatile memory circuit 310. Since the flag information included in the data set 403 is '0', the repair selection circuit 323 may activate the second selection signal RS<1>, and the $0^{th}$ to $(N-1)^{th}$ bits, which are repair information included in the data set 403, may be stored in the repair register set 342.

(4) The data set 404 may be read and output from the nonvolatile memory circuit 310. Since the flag information included in the data set 404 is '0', the repair selection circuit 323 may activate the third selection signal RS<2>, and the $0^{th}$ to $(N-1)^{th}$ bits, which are repair information included in the data set 404, may be stored in the repair register set 343. To have a look at the $0^{th}$ to $(N-1)^{th}$ bits, which are repair information included in the data set 404, it may be seen that all values are '0'. This may mean that the repair information included in the data set 404 is not valid. Namely, all values of the data set 404 even including the flag information are '0', which may mean that the data set 404 has never been recorded. Since the repair information included in the data set 404 is invalid, a boot-up operation itself may not be performed on the data set 404. In short, the nonvolatile memory circuit 310 may not perform the operation of outputting data included in the data set 404 whose information is invalid.

(5) The data set 405 may be read and output from the nonvolatile memory circuit 310. Since the flag information included in the data set 405 is '1', the setting selection circuit 321 may decode the setting address to activate one of the selection signals SS<0:3>. Since the setting address, which occupies $(N-1)^{th}$ to $(N-2)^{th}$ bits, included in the data set 405 are '11', the setting selection circuit 321 may activate the selection signal SS<3>, and $0^{th}$ to $(N-3)^{th}$ bits, which are setting information included in the data set 405, which may be stored in the setting register set 334.

(6) The data set 406 may be read and output from the nonvolatile memory circuit 310. Since the flag information included in the data set 406 is '0', the repair selection circuit 323 may activate the fourth selection signal RS<3>, and the $0^{th}$ to $(N-1)^{th}$ bits, which are repair information included in the data set 406, which may be stored in the repair register set 344.

After the boot-up operation is completed, no information may be stored in the setting register sets 331 and 332. This is because the nonvolatile memory circuit 310 does not store the setting information to be stored in the setting register sets 331 and 332. When the setting operation of the internal circuits 350_0 and 350_1 is not necessary or omittable, no data may be stored in the setting register sets 331 and 332 even after the boot-up operation is completed. Similarly, even after the boot-up operation is completed, no data may be stored in some repair register sets.

The use of the data sets 401 to 406 stored in the nonvolatile memory circuit 310 may not be predetermined. For example, the data sets 401 to 406 may be used for repair or setting according to the value of flag information. Also, the type of setting may be flexibly changed according to the value of the stored setting address. Accordingly, it may be possible to flexibly use the resources of the nonvolatile memory circuit 310.

According to the embodiment of the present invention, resources that are required for memory repair and configuration may be efficiently used.

While the present invention has been described with respect to specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory comprising:
a memory array;
a nonvolatile memory circuit configured to store a plurality of data sets each including flag information and multi-bit data;
a plurality of repair register sets configured to receive and store the multi-bit data included in the data sets;
a plurality of setting register sets configured to store setting information included in the data sets; and
a repair circuit configured to repair a defect in the memory array based on the multi-bit data stored in the repair register sets,
wherein the flag information of the data sets is used for repair or setting according to a value of the flag information during a boot-up operation,
wherein the multi-bit data included in each of the data sets includes a setting address and the setting information, and
wherein the memory further comprises a setting selection circuit configured to select one of the setting register sets by decoding the setting addresses of the respective data sets.

2. The memory of claim 1,
wherein one of the setting register sets is selected based on the setting address, and
wherein the setting information corresponding to the setting address is stored in the selected setting register set.

3. The memory of claim 1, further comprising a repair selection circuit configured to control the multi-bit data included in the respective data sets wherein the flag information of the respective data sets is marked for repair among the data sets to be sequentially stored in the repair register sets.

4. The memory of claim 1, further comprising internal circuits configured to operate based on the setting information stored in the setting register sets.

5. The memory of claim 1, wherein the nonvolatile memory circuit is an e-fuse array circuit.

6. An integrated circuit, comprising:
a nonvolatile memory circuit configured to store first data sets each including first-level flag information and data, and second data sets each including second-level flag information, a setting address, and setting information;
a plurality of first register sets respectively configured to store the data included in the first data sets that are read from the nonvolatile memory circuit;
a plurality of second register sets each configured to store the setting information included in the second data set which includes the setting address corresponding thereto among the second data sets that are read from the nonvolatile memory circuit;
a first selection circuit configured to control the data included in the first data sets that are read from the nonvolatile memory circuit to be sequentially stored in the respective first register sets; and
a second selection circuit configured to generate selection signals corresponding to the respective second register sets by decoding the set addresses of the respective second data sets that are read from the nonvolatile memory circuit.

7. The integrated circuit of claim 6,
wherein the data included in the first data set is repair information, and
wherein the integrated circuit further comprises:
a memory array;
a repair circuit configured to repair a defect in the memory array based on the repair information stored in the first register sets; and
internal circuits configured to operate based on the setting information stored in the second register sets.

8. A method for operating a memory, comprising:
reading a first data set from a nonvolatile memory circuit;
confirming that flag information included in the first data set is of a first level;
storing repair information included in the first data set in one among a plurality of repair register sets;
reading a second data set from the nonvolatile memory circuit;
confirming that flag information included in the second data set is of a second level;
selecting one of a plurality of setting register sets by decoding a setting address included in the second data set; and
storing setting information included in the second data set in the selected setting register set.

9. The method of claim 8, further comprising:
reading a third data set from the nonvolatile memory circuit;
confirming that flag information included in the third data set is of the first level; and
storing repair information included the third data set in another repair register set among the repair register sets.

10. The method of claim 9, further comprising:
reading a fourth data set from the nonvolatile memory circuit;
confirming that flag information included in the fourth data set is of the first level;
confirming that repair information included in the fourth data set is invalid; and
preventing the repair information included in the fourth data set from being loaded from the nonvolatile memory circuit in response to the confirmation of invalidity.

11. The method of claim 9, further comprising repairing a memory array based on the repair information stored in the repair register sets.

12. The method of claim 9, further comprising performing a setting operation based on the setting information stored in the setting register sets.

13. The method of claim 9, wherein a type of setting information is changed according to a value of the setting address.

* * * * *